(12) United States Patent
Kim et al.

(10) Patent No.: US 7,961,008 B2
(45) Date of Patent: Jun. 14, 2011

(54) DATA OUTPUT DRIVING CIRCUIT OF SEMICONDUCTOR MEMORY APPARATUS

(75) Inventors: Kyung-Hoon Kim, Ichon-shi (KR); Tae-Heui Kwon, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/647,491

(22) Filed: Dec. 29, 2006

(65) Prior Publication Data

US 2007/0194805 A1    Aug. 23, 2007

(30) Foreign Application Priority Data

Feb. 22, 2006 (KR) .................. 10-2006-0017173

(51) Int. Cl.
*H03K 19/094* (2006.01)
(52) U.S. Cl. ............. 326/87; 326/30; 327/109; 327/112
(58) Field of Classification Search .................. 326/30, 326/82–83, 86–87; 327/108–109, 112
See application file for complete search history.

(56) References Cited

U.S. PATENT DOCUMENTS

| | | | |
|---|---|---|---|
| 6,256,235 B1 * | 7/2001 | Lee | |
| 6,373,286 B1 * | 4/2002 | Loeffler et al. | 326/86 |
| 6,445,245 B1 * | 9/2002 | Schultz et al. | 327/541 |
| 6,445,316 B1 * | 9/2002 | Hsu et al. | |
| 6,459,320 B2 * | 10/2002 | Lee | 327/310 |
| 6,703,908 B1 | 3/2004 | Ruesch et al. | |
| 6,856,164 B2 * | 2/2005 | Park et al. | |
| 6,909,305 B1 * | 6/2005 | Li et al. | 326/30 |
| 6,985,009 B2 | 1/2006 | Nishio et al. | |
| 7,019,552 B2 | 3/2006 | Wang et al. | |
| 7,038,486 B2 * | 5/2006 | Aoyama et al. | 326/30 |
| 7,068,078 B2 * | 6/2006 | Yoo | 326/87 |
| 7,212,035 B2 * | 5/2007 | Dreps et al. | 326/83 |
| 7,227,382 B1 * | 6/2007 | Talbot et al. | 326/87 |
| 7,282,955 B2 * | 10/2007 | Kim | 326/87 |
| 7,295,033 B2 * | 11/2007 | Chung et al. | 326/30 |
| 7,317,328 B2 * | 1/2008 | Kim | 326/30 |
| 2003/0052345 A1 | 3/2003 | Isa et al. | |
| 2004/0174185 A1 * | 9/2004 | Lin et al. | 326/30 |

(Continued)

FOREIGN PATENT DOCUMENTS

JP     2004312262     11/2004

(Continued)

OTHER PUBLICATIONS

Rhyne "Fundamentals of Digital Systems Design" N.J., 1973 pp. 70-71.*

(Continued)

*Primary Examiner* — James H. Cho
*Assistant Examiner* — Jason M Crawford
(74) *Attorney, Agent, or Firm* — Venable LLP; Jeffri A. Kaminski

(57) ABSTRACT

A data output driving circuit includes a plurality of driving units that are set to have different impedance values from one another, and the number of driving units is less than the number of a plurality of required driving impedance values such that the driving units can obtain the plurality of required driving impedance values by a combination thereof, and a driving control unit that independently controls the operation of the plurality of driving units so as to obtain the plurality of driving impedance values required.

32 Claims, 4 Drawing Sheets

U.S. PATENT DOCUMENTS

| | | | |
|---|---|---|---|
| 2005/0040845 A1* | 2/2005 | Park | 326/30 |
| 2005/0077929 A1 | 4/2005 | Egerer et al. | |
| 2005/0226080 A1 | 10/2005 | Lee | |
| 2007/0146004 A1* | 6/2007 | Park et al. | 326/30 |
| 2008/0278192 A1* | 11/2008 | Lee | |

FOREIGN PATENT DOCUMENTS

| | | |
|---|---|---|
| JP | 2005065249 | 3/2005 |
| KR | 1020020021450 | 3/2002 |
| KR | 1020020037605 | 5/2002 |
| KR | 1020030047035 | 6/2003 |

OTHER PUBLICATIONS

Rhyne "Fundamentals of Digital Systems Design" N.J., 1973 pp. 70-71 (Provided to Applicant in Previous Rejection mailed Feb. 7, 2008).*

Rhyne "Fundamentals of Digital Systems Design" N.J. 1973 pp. 70-71.*

\* cited by examiner

DATA OUTPUT DRIVING CIRCUIT OF SEMICONDUCTOR MEMORY APPARATUS

BACKGROUND OF THE INVENTION

1. Technical Field

The present invention relates to a semiconductor memory apparatus, and more particularly, to a data output driving circuit of a semiconductor memory apparatus.

2. Related Art

In general, a semiconductor memory apparatus includes a plurality of drivers that have predetermined impedance values so, as to correspond to various data input and output impedances and can obtain the various input and output impedances by selectively operating the plurality of drivers.

As shown in FIG. 1, a data output driving circuit of the semiconductor memory apparatus according to the related art includes a plurality of drivers 40; an impedance adjusting unit 10 that outputs a first code PC<0:5> and a second code NC<0:5> to adjust the impedance of the drivers so that the total impedance is equal to a set value; a plurality of driver control units 20 that determine whether or not to output the first code PC<0:5> and the second code NC<0:5> according to a driver enable signal stinf<0:6>; a plurality of data processing units 30 that output data (UP: pull-up data and DN: pull-down data) to the plurality of drivers 40, according to the first code PC<0:5> and the second code NC<0:5>; and a pad 50 that is commonly connected to the output terminals of the plurality of drivers 40, and outputs the data or receives data.

FIG. 1 depicts an example in which seven drivers with the same impedance value (i.e., 240 ohm), seven driver control units 20, and seven data processing units 30 are used.

Each of the plurality of drivers 40 of FIG. 1 includes a pull-up driver and a pull-down driver. The pull-up driver includes a plurality of PMOS transistors that have sources connected in common to a power supply terminal VDDQ and drains respectively connected to resistors. The pull-down driver includes a plurality of NMOS transistors that have sources connected in common to a ground terminal and drains respectively connected to data pull-down resistors. Each of the pull-up drivers and the pull-down drivers include, for example, six resistors and six transistors for controlling the connection of the resistors. The number of resistors and the number of transistors may vary according to the circuit design.

Referring to FIG. 1, the operation of the data output driving circuit for the semiconductor memory apparatus according to the related art will now be described.

The impedance adjusting unit 10 outputs the first code PC<0:5> and the second code NC<0:5> for adjusting the impedance of each of the drivers, so as to correct a difference between the impedance value and a predetermined set value.

According to the driver enable signal stinf<0:6>, the seven driver control units 20 output the first code PC<0:5> and the second code NC<0:5> output from the impedance adjusting unit 10 to the seven data processing units 30, or the seven driver control units 20 intercept the output of the first code PC<0:5> and the second code NC<0:5> by setting the code values of the first code PC<0:5> and the second code NC<0:5> to predetermined values (e.g., 0).

When the first code PC<0:5> and the second code NC<0:5> are input, the seven data processing units 30 output pull-up data UP to the pull-up drivers of the seven drivers 40 according to the first code PC<0:5>, and output pull-down data DN to the pull-down drivers of the seven drivers 40 according to the second code NC<0:5>.

Therefore, a data driving operation is performed according to a driving impedance value on the basis of an impedance combination of the drivers, which have received the data, among the seven drivers 40.

According to the related art, the impedance of the driver is determined on the basis of the largest value among driving impedance values required for a system, and the number of drivers that have the same determined impedance is determined, such that various driving impedances required for the system can be obtained.

For example, when the maximum value of the driving impedance required for the system is 240 ohm, and the minimum value is 34 ohm, as shown in FIG. 1, 240 ohm drivers are used. In order to obtain the minimum value of 34 ohm, the seven 240 ohm drivers are used. The number of drivers used is based on the principle of the parallel connections of resistors.

That is, when a 34 ohm driver is necessary, all of the seven 240 ohm drivers are connected in parallel to one another to obtain a value of $1/(1/240+1/240+1/240+1/240+1/240+1/240+1/240)=240/7=34.285\ldots$ If a small difference occurs (for example, a difference of a decimal fraction), this does not affect the driving operation. Therefore, the difference may be ignored.

When a 40 ohm driver is required, six drivers among the seven 240 ohm drivers are connected in parallel to one another to obtain a value of $1/(1/240+1/240+1/240+1/240+1/240+1/240)=240/6=40$.

When a 60 ohm driver is required, four 240 ohm drivers among the seven 240 ohm drivers are connected in parallel to one another. When an 80 ohm driver is required, three 240 ohm drivers among the seven 240 ohm drivers are connected in parallel to one another. When a 120 ohm driver is required, two 240 ohm drivers among the seven 240 ohm drivers are connected in parallel to each other. When a 240 ohm driver is required, one of the seven 240 ohm drivers is used. As such, the seven drivers are selectively operated to thereby obtain the driving impedance required for the system.

At this time, MOS (Metal on Silicide) resistors and passive resistors are used together in the drivers. In order to achieve linear driving, the number of passive resistors needs to be much larger than the number of the MOS resistors. For example, in the case of the 240 ohm driver, the MOS resistors and the passive resistors have a ratio of approximately 2:8.

Since a MOS resistor has a larger resistance value per unit area than that of a passive resistor, a passive resistor needs to have an area larger than a MOS resistor for the same resistance value. A MOS resistor uses an active region, while a passive resistor uses a gate region and a poly region where a complex control operation can be performed.

Therefore, the area of the drivers is determined according to the passive resistors. According to the related art, the higher the impedance a driver has, the larger the number of passive resistors used Therefore, the drivers occupy a large area in the semiconductor memory apparatus.

In addition, the capacitance of a driver is determined according to a junction capacitance and a parasitic capacitance. Between the two capacitances, the junction capacitance occupies the most capacitance. Since a passive resistor has a larger parasitic capacitance than a junction capacitor, the capacitance increases as the number of passive resistors increases.

Therefore, the data output driving circuit of a semiconductor memory apparatus according to the related art has the following problems.

First, as described above, as the impedance of the driver increases, the size of the driver increases. According to the related art, since a plurality of drivers that have high impedance values are used, the size of the semiconductor memory apparatus is increased.

Second, since the number of passive resistors is increased due to the plurality of high impedance drivers, the capacitance is increased, which deteriorates the impedance characteristics of the drivers.

SUMMARY

Embodiments of the present invention provide a data output driving circuit of a semiconductor memory apparatus that is capable of reducing the size of a semiconductor memory apparatus and improving its impedance characteristics.

An embodiment of the present invention provides a data output driving circuit of a semiconductor memory apparatus that may include a plurality of driving units with different impedance values, and the number of drivers may be less than the number of a plurality of required driving impedance values, such that the driving units can obtain the plurality of required driving impedance values by a combination thereof; and a driving control unit that may independently control the operation of the plurality of driving units so as to obtain the plurality of driving impedance values required.

Another embodiment of the present invention provides a data output driving circuit of a semiconductor memory apparatus that may include a plurality of driving units, the number of drivers may be less than the number of required driving impedance values, in which an impedance value corresponding to the lowest common multiple of the required driving impedance values may be set, and other impedance values corresponding to divisors of the lowest common multiple may be set such that the driving units can obtain the required driving impedance values by combining the lowest common multiple with the divisors; a plurality of driver control units that may determine whether or not to output one or more codes so as to set the impedance of the plurality of driving units according to a driver enable signal; and a plurality of data processing units that may output data to the plurality of driving units according to the one or more codes.

Still another embodiment of the present invention provides a data output driving circuit of a semiconductor memory apparatus that may include a first driving unit that may be set to have an impedance value equal to the maximum impedance value of a plurality of target impedance values; a second driving unit that may be set to have an impedance value equal to or larger than the minimum value of the target impedance values that corresponds to a divisor of the maximum impedance value; a third driving unit that may be set to have an impedance value equal to or larger than the minimum value among the target impedance values, corresponding to a divisor of the maximum impedance value, and smaller than the impedance value of the second driving unit; and a driving control unit that may selectively operate the first to third driving units so as to obtain all of the plurality of target impedance values.

DESCRIPTION OF EXEMPLARY EMBODIMENTS

Embodiments of the present invention will now be described in detail with reference to the accompanying drawings.

Figure 1:
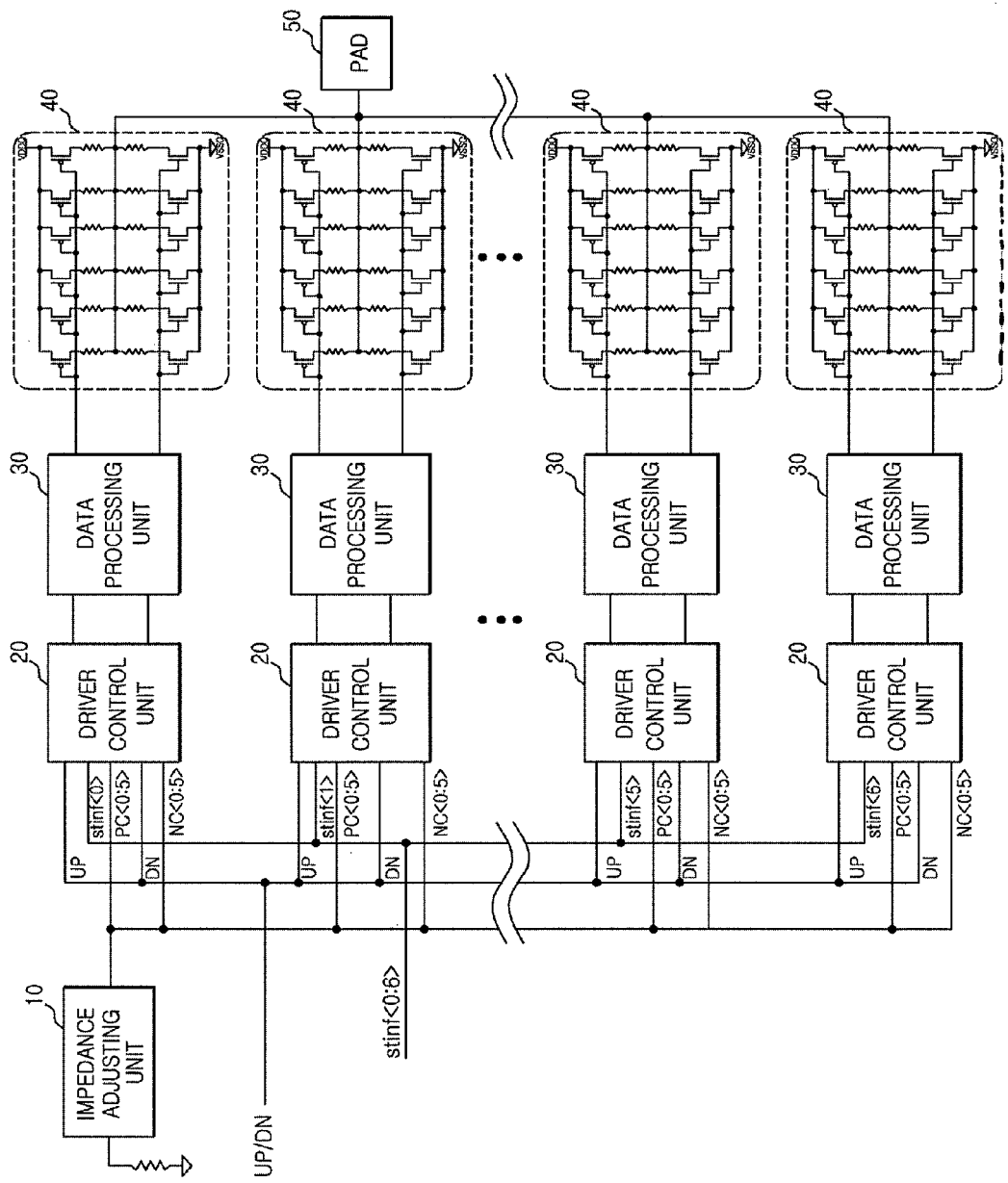
FIG. 1 is a block diagram of a data output driving circuit of a semiconductor memory apparatus according to the related art.
Figure 2:
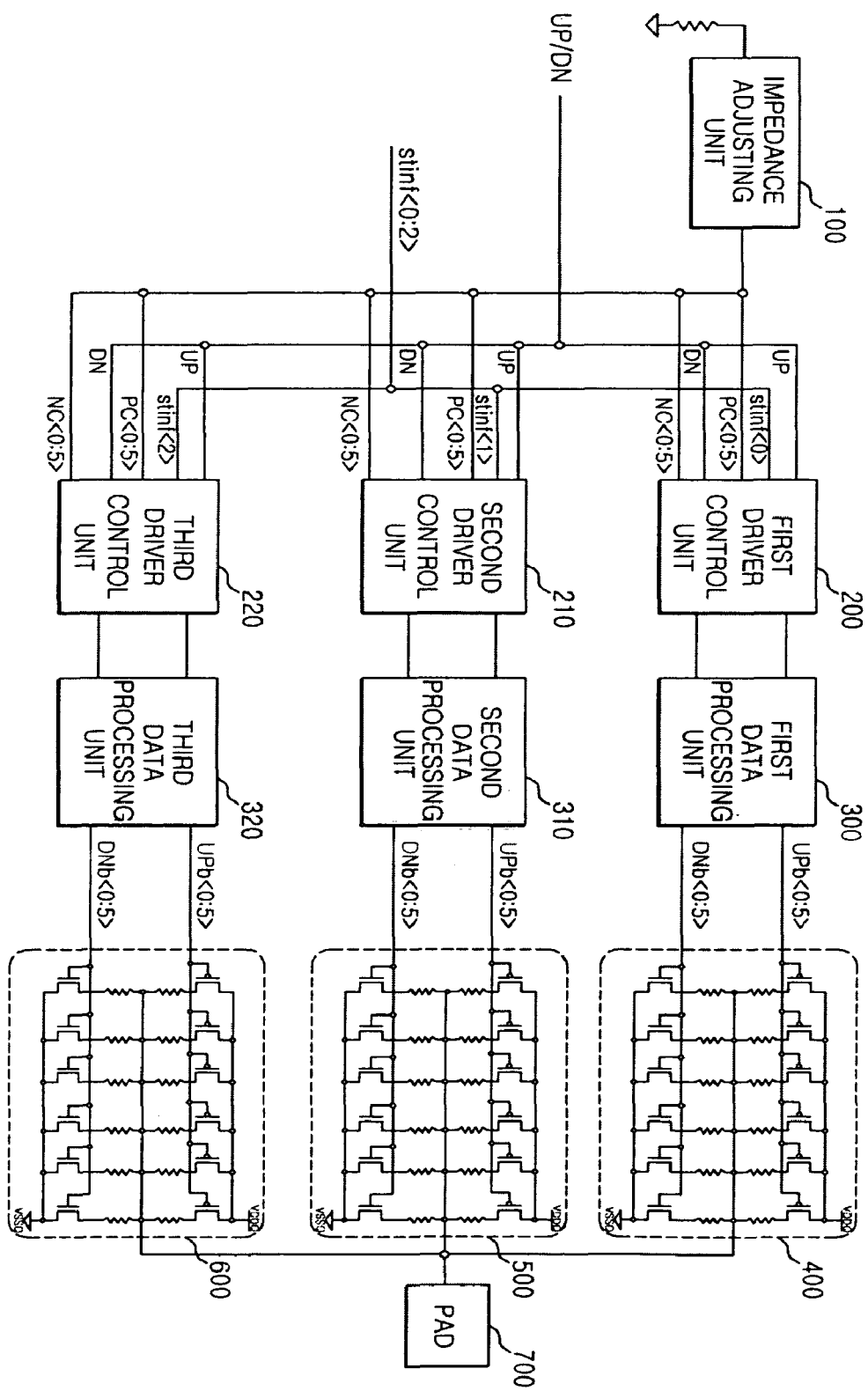
FIG. 2 is a block diagram of a data output driving circuit of a semiconductor memory apparatus according to an embodiment of the present invention.

As shown in FIG. 2, a data output driving circuit of a semiconductor memory apparatus according to an embodiment of the present invention includes first to third drivers 400, 500, and 600; an impedance adjusting unit 100 that outputs a first code PC<0:5> and a second code NC<0:5> to adjust an impedance value in each of the first to third drivers 400, 500, and 600 to a set value, first to third driver control units 200, 210, and 220 that determine whether or not to output the first code PC<0:5> and the second code NC<0:5> according to a driver enable signal stinf<0:2>; first to third data processing units 300, 310, and 320 that output data (UP: pull-up data and DN: pull-down data) to the first to third drivers 400, 500, and 600, respectively, according to the first code PC<0:5> and the second code NC<0:5>; and a pad 700 that is commonly coupled to output terminals of the first to third drivers 400, 500, and 600, that outputs the data or inputs data.

Each of the first to third drivers 400, 500, and 600 may include both a pull-up driver and a pull-down driver. The pull-up driver includes a plurality of PMOS transistors that have sources coupled in common to a power supply terminal VDDQ and drains respectively coupled to resistors. The pull-down driver includes a plurality of NMOS transistors that have sources coupled in common to a ground terminal and drains respectively coupled to resistors. Each of the pull-up drivers and the pull-down drivers may include, for example, six resistors and six transistors for controlling the connection of the resistors. The number of the resistors and the number of the transistors may vary according to the circuit design.

According to an embodiment of the present invention, the smallest number of drivers is used, which have an impedance smaller than the impedance in the related art, and the drivers are combined to obtain all of the impedance values required for a system. In the embodiment of the present invention shown in FIG. 2, a much smaller number of drivers than the number of drivers used in the related art are used (i.e., seven 240 ohm drivers) That is, the first to third drivers 400, 500, and 600 may have impedance values of 240 ohm, 120 ohm, and 60 ohm, respectively, such that driving impedance values of 34 ohm, 40 ohm, 60 ohm, 80 ohm, 120 ohm, and 240 ohm may be obtained.

An exemplary configuration of the above-described drivers will be described below. First, a driver having an impedance corresponding to the lowest common multiple of the driving impedance values for the system is provided. According to the above-described embodiment of FIG. 2, the driving impedance values required for the system are 34 ohm, 40 ohm, 60 ohm, 80 ohm, 120 ohm, and 240 ohm. The lowest common multiple of 34 ohm, 40 ohm, 60 ohm, 80 ohm, 120 ohm, and 240 ohm is 240 ohm. However, in the case of the 34 ohm, 240 ohm cannot be said to be the exact lowest common multiple thereof. However, it may be impossible to consider a value of the lowest common multiple up to a difference below a decimal point in the circuit design. Since this difference hardly affects the driving operation, it is not a concern.

Then, drivers that have impedances corresponding to the smallest number of divisors, which can obtain driving impedances of 120 ohm, 60 ohm, 80 ohm, 40 ohm, and 34 ohm, among the divisors of the lowest common multiple are provided by a combining the drivers according to the parallel connection of the resistors. The driving impedance is determined by the combination of the drivers, that is, by internal resistors of the drivers that are coupled in parallel to one another. Therefore, the smallest number of divisors that can obtain the driving impedances of 120 ohm, 80 ohm, 60 ohm, 40 ohm, and 34 ohm is two, that is, 120 ohm and 60 ohm.

When the 240 ohm driver, the 120 ohm driver, and the 60 ohm driver are coupled to one another in parallel, the driving impedance becomes $1/(1/240+1/120+1/60)=240/7=34.285\ldots$. Since a small difference (a difference of a decimal point) hardly affects the driving operation and may be ignored, the driving impedance of 34 ohm can be obtained.

Further, when the 120 ohm driver and the 60 ohm driver are coupled to each other in parallel, the driving impedance becomes $1/(1/120+1/60)=120/3=40$. Therefore, the driving impedance of 40 ohm can be obtained.

As such, it is possible to obtain the driving impedance of 60 ohm by using one 60 ohm driver, the driving impedance of 80 ohm by connecting the 240 ohm and 120 ohm drivers to each other in parallel, the driving impedance of 120 ohm by using one 120 ohm driver, and the driving impedance of 240 ohm by using one 240 ohm driver.

An example in which the first driver 400, the second driver 500, and the third driver 600 have impedances of 240 ohm, 120 ohm, and 60 ohm, respectively is described below.

In the embodiment of the present invention, the number of drivers used may be reduced compared with that in the related art, while still obtaining the same driving impedance. However, the number of drivers that are used may vary according to the driving impedance required for the system.

Figure 3:
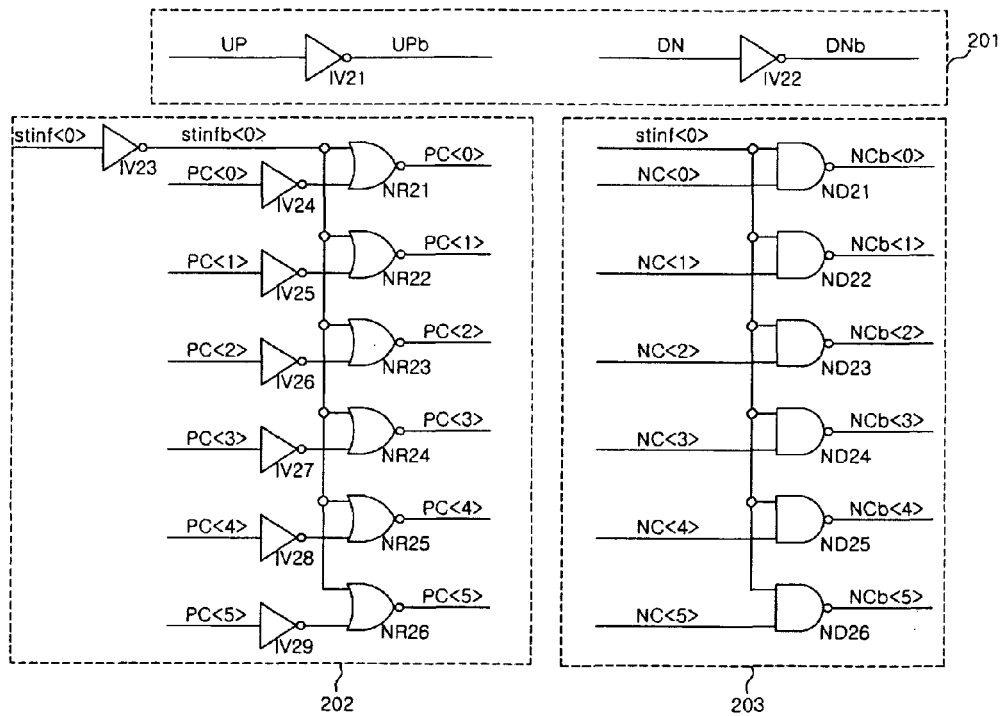
FIG. 3 is a circuit diagram of the first driver control unit of FIG. 2.

As shown in FIG. 3, an exemplary first driver control unit 200 may include a data converting unit 201 that converts data to enable pull-up and pull-down driving; a pull-up driver control unit 202 that determines whether or not to output the first code PC<0:5> according to a driver enable signal stinf<0>; and a pull-down driver control unit 203 that determines whether or not to output the second code NC<0:5> according to the driver enable signal stinf<0>. The second driver control unit 210 and the third driver control unit 220 may have the same configuration as the first driver control unit 200.

The data converting unit 201 may include a first inverter IV21 that receives pull-up data UP and outputs the inverted pull-up data UPb, and a second inverter IV22 that receives the pull-down data DN and outputs the inverted pull-down data DNb.

The pull-up driver control unit 202 may include a third inverter IV23 that receives the driver enable signal stinf<0> and outputs the inverted driver enable signal stinfb<0>, fourth to ninth inverters IV24 to IV29 that receive the first code PC<0:5>, and first to sixth NOR gates NR21 to NR26 that have first input terminals to which the inverted driver enable signal stinfb<0> is commonly input and second input terminals to which outputs of the fourth to ninth inverters IV24 to IV29 are input respectively, such that the first to sixth NOR gates NR21 to NR26 output the first code PC<0:5>.

The pull-down driver control unit 203 may include first to sixth NAND gates ND21 to ND26 that have first input terminals to which the driver enable signal stinf<0> is commonly input, and second input terminals to which the second code NC<0:5> is input, such that the sixth NAND gates ND21 to ND26 output the inverted second code NCb<0:5>.

Figure 4:
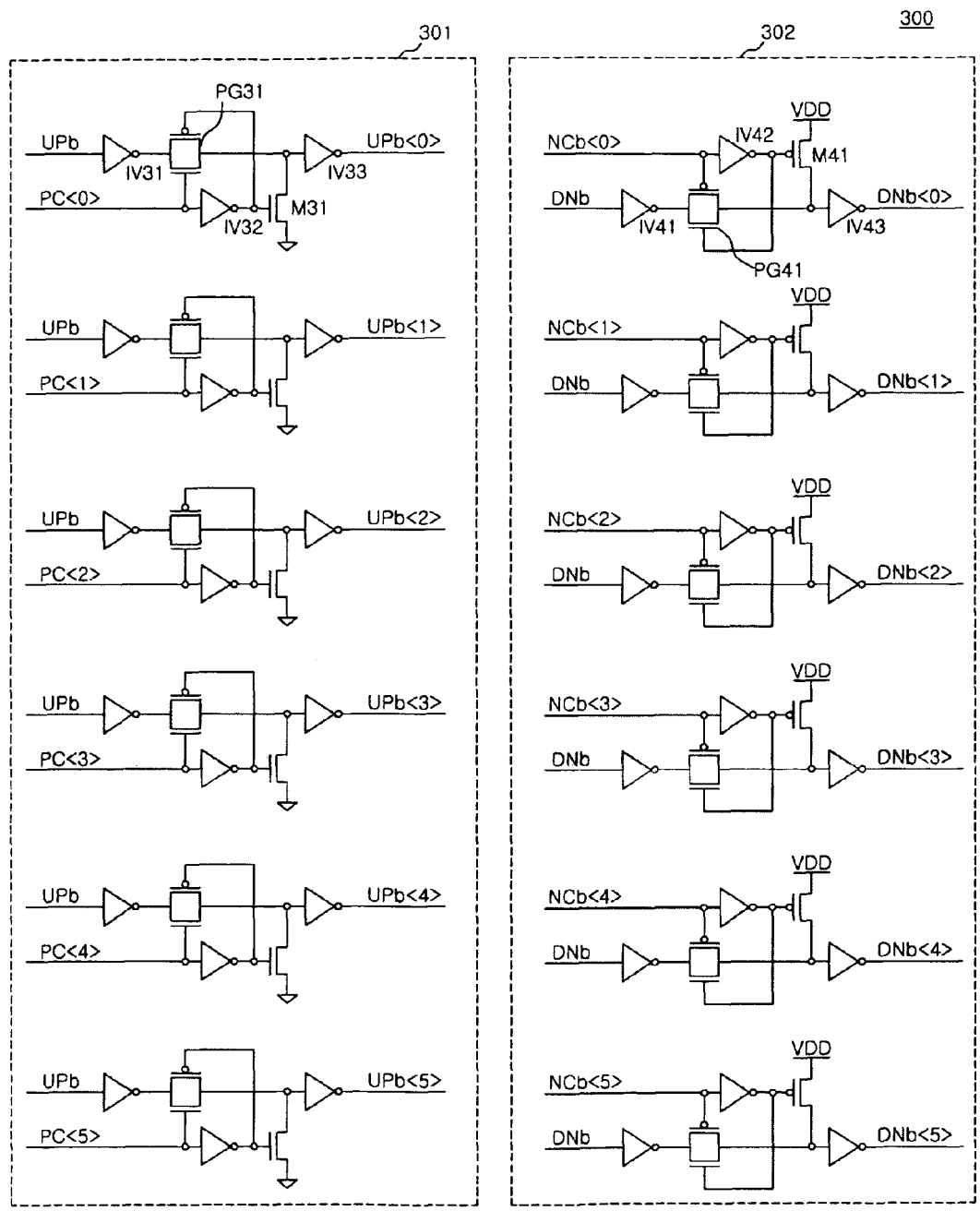
FIG. 4 is a circuit diagram of the first data processing unit of FIG. 2.

As shown in FIG. 4, an exemplary first data processing unit 300 may include a pull-up data processing unit 301 that outputs the inverted pull-up data UPb<0:5> to the first driver 400 according to the first code PC<0:5>, and a pull-down data processing unit 302 that outputs the inverted pull-down data DNb<0:5> to the first driver 400 according to the inverted second code NCb<0:5>. The second and third data processing units 310 and 320 may have the same configuration as the first data processing unit 300.

The pull-up data processing unit 301 may include as many logic circuits, which determine whether or not to output the inverted pull-up data UPb, as the number of bits of the first code PC<0:5>. Since all of the logic circuits may have the same configuration, only the logic circuit, which receives the first code PC<0> will be described as follows. The logic circuit may include a first inverter IV31 that receives the inverted pull-up data UPb; a second inverter IV32 that receives the first code PC<0>; a pass gate PG31 that has an input terminal receiving an output of the first inverter IV31, a first control terminal receiving an output of the second inverter IV32, and a second control terminal receiving the first code PC<0>; a transistor M31 that has a gate receiving the output of the second inverter IV32, a drain coupled to an output terminal of the pass gate PG31, and a source coupled to a ground terminal; and a third inverter IV33 that is coupled to the drain of the transistor M31.

The pull-down data processing unit 302 may include as many logic circuits, which determine whether or not to output the inverted pull-down data DNb, as the number of bits of the inverted second code NCb<0:5>. Since all of the logic circuits may have the same configuration, only the logic circuit which receives the inverted second code NCb<0> will be described as follows. The logic circuit may include a first inverter IV41 that receives the inverted pull-down data DNb; a second inverter IV42 that receives the inverted second code NCb<0>; a pass gate PG41 that has an input terminal receiving an output of the first inverter IV41, a first control terminal receiving the inverted second code NCb<0>, and a second control terminal receiving an output of the second inverter IV42; a transistor M41 that has a gate receiving the output of the second inverter IV42, a source coupled to an output terminal of the pass gate PG41, and a drain coupled to a power supply terminal VDD; and a third inverter IV43 coupled to the source of the transistor M41.

An exemplary output driving operation of the semiconductor memory apparatus according to an embodiment of the present invention that has the above-described configuration will now be described.

First, a description will be made of an example in which the driving impedance required for the system is 240 ohm.

As described above, according to an embodiment of the present invention, the first driver 400 has an impedance of 240 ohm, the second driver 500 has an impedance of 120 ohm, and the third driver 600 has an impedance of 60 ohm.

In order to obtain the driving impedance of 240 ohm, the driver enable signal stinf<0:2> is set to "1(high) 0(low) 0(low)". The driver enable signal stinf<0:2> may be set using a mode resistor for setting various operating conditions of the semiconductor memory apparatus.

Therefore, the first driver control unit 200 of FIG. 3 outputs the pull-up data UPb and the pull-down data DNb that are inverted in the data converting unit 201. The pull-up driver control unit 202 outputs the first code PC<0:5> to the first data processing unit 300 because the driver enable signal stinf<0> is at a high level. The pull-down driver control unit 203 outputs the inverted second code NCb<0:5> to the first data processing unit 300 because the driver enable signal stinf<0> is at a high level. Meanwhile, the second driver control unit 210 and the third driver control unit 220 change the first code PC<0:5> to low level and the inverted second code NCb<0:5> to high level because the driver enable signals stinf<1> and stinf<2> are at a low level.

When the first code PC<0:5>, which is input to the pull-up data processing unit 301, is at a high level, the pull-up data processing unit 301 of the first data processing unit 300 of FIG. 4 outputs the corresponding inverted pull-up data UPb<0:5> to the first driver 400. For example, when the first code PC<0> is at a high level, since the pass gate PG31 is turned on, the inverted pull-up data UPb<0> is output to the first driver 400. Further, when the code of the inverted second code NCb<0:5>, which is input to the pull-down data processing unit 302, is at a low level, the pull-down data processing unit 302 outputs the corresponding inverted pull-down data DNb<0:5> to the first driver 400. For example, when the second code NCb<0> is at a low level (here, the code NC<0> is at high level), since the pass gate PG41 is turned on, the inverted pull-down data DNb<0> is output to the first driver 400. Meanwhile, in the second data processing unit 310 and the third data processing unit 320, the pass gates PG31 and PG41 are all turned off because the first code PC<0:5> is at a low level and the inverted second code NCb<0:5> is at a high level. As a result, the second data processing unit 310 and the third data processing unit 320 may not output the inverted pull-up data UPb<0> and the inverted pull-down data DNb<0:5> to the second driver 500 and the third driver 600, respectively.

Therefore, the second driver 500 and the third driver 600 do not operate, and only the first driver 400 operates. Accordingly, the first driver 400 performs the driving operation on the inverted pull-up data UPb<0> and the inverted pull-down data DNb<0:5> with a driving impedance of 240 ohm, and outputs the data via the pad 700.

A description is made of another example in which the driving impedance required for the system is 80 ohm.

As described above, according to an embodiment of the present invention, the first driver 400 has an impedance of 240 ohm, the second driver 500 has an impedance of 120 ohm, and the third driver 600 has an impedance of 60 ohm.

In order to obtain a driving impedance of 80 ohm, the 240 ohm driver and the 120 ohm driver may be coupled in parallel to each other. Therefore, the driver enable signal stinf<0:2> is set to "1(high) 1(high) 0(low)".

Therefore, the first driver 400 and the second driver 500 operate and perform the data driving operation with a driving impedance of 80 ohm.

A description will be made of still another example in which the driving impedance required for the system is 34 ohm.

As described above, according to an embodiment of the present invention, the first driver 400 has an impedance of 240 ohm, the second driver 500 has an impedance of 120 ohm, and the third driver 600 has an impedance of 60 ohm.

In order to obtain a driving impedance of 34 ohm, the 240 ohm driver, the 120 ohm driver, and the 60 ohm driver may be coupled in parallel to one another. Therefore, the driver enable signal stinf<0:2> is set to "1(high) 1(high) 1(high)".

Therefore, the first driver 400, the second driver 500, and the third driver 600 all operate, and perform a data driving operation with a driving impedance of 34 ohm.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

According to the data output driving circuit for a semiconductor memory apparatus in an embodiment of the present invention, the following effects may be obtained.

First, a plurality of drivers that have high impedance are used in the related art, while in embodiments of the present invention, the number of drivers may be reduced and the drivers may have low impedance. Therefore, it may be possible to remarkably reduce a size of the semiconductor memory apparatus.

Second, since the number of drivers may be smaller than that in the related art and the drivers may have smaller impedance than in the related art, the number of passive resistors may also reduced to thereby reduce the capacitance. As a result, it may be possible to improve the impedance characteristics of the drivers.

What is claimed is:

1. A data output driving circuit of a semiconductor memory apparatus comprising:
   a plurality of driving units connected in parallel and having different impedance values from one another; and
   a driving control unit configured to selectively operate the plurality of driving units in different combinations corresponding to each of the driving impedance values, wherein the plurality of driving units are connected in parallel and the driving control unit outputs:
   pull-up and pull-down data to the driving units according to a first code and a second code, wherein the driving control unit selects one or more driving units of the plurality of driving units in response to a driver enable signal, and
   the driving control unit outputs the pull-up data and the pull-down data corresponding to the first and second code to selected driving units and outputs the pull-up data and pull-down data fixed at a specific level regardless of the first and second code to un-selected driving units.

2. The data output driving circuit of claim 1, wherein the driving unit includes:
   a plurality of first resistors, each of which having first and second terminals, the first terminals being commonly coupled to each other;
   a plurality of first switching elements, each of which is coupled between the second terminal of respective ones of the first resistors and a power supply terminal;
   a plurality of second resistors, each of having first and second terminals, the first terminals being commonly coupled to each other; and
   a plurality of second switching elements, each of which is coupled between the second terminal of respective ones of the second resistors and a ground terminal.

3. The data output driving circuit of claim 1, wherein the driving control unit includes:
   a plurality of driver control units configured to determine whether or not to output one or more codes for setting the impedance of the plurality of driving units according to the driver enable signal; and
   a plurality of data processing units configured to output data to the plurality of driving units according to the one or more codes.

4. The data output driving circuit of claim 3,
wherein the driver control unit includes:
a data converting unit configured to convert the data to enable pull-up and pull-down driving;
a pull-up driver control unit configured to determine whether or not to output the first code from the one or more codes according to the driver enable signal; and
a pull-down driver control unit configured to determine whether or not to output the second code from the one or more codes according to the driver enable signal.

5. The data output driving circuit of claim 4,
wherein the data converting unit includes:
a first inverter configured to receive the pull-up data and output inverted pull-up data; and
a second inverter configured to receive the pull-down data and output inverted pull-down data.

6. The data output driving circuit of claim 5,
wherein the data processing unit includes:
a pull-up data processing unit configured to output the inverted pull-up data to the driving unit according to the first code; and
a pull-down data processing unit configured to output the inverted pull-down data to the driving unit according to an inverted second code.

7. The data output driving circuit of claim 6,
wherein the pull-up data processing unit includes logic circuits, each of which includes:
a first inverter configured to receive the inverted pull-up data and to produce an output;
a second inverter configured to receive the first code and to produce an output signal;
a pass gate that has an input terminal configured to receive the output of the first inverter, a first control terminal configured to receive the output of the second inverter, a second control terminal configured to receive the first code, and an output terminal;
a transistor that has a gate configured to receive the output of the second inverter, a drain coupled to the output terminal of the pass gate, and a source coupled to ground; and
a third inverter that is coupled to the drain of the transistor; and wherein
a number of logic circuits is equal to a number of bits of the first code.

8. The data output driving circuit of claim 6,
wherein the pull-down data processing unit includes logic circuits, each of which includes:
a first inverter configured to receive the inverted pull-down data and to produce an output;
a second inverter configured to receive the inverted second code and to produce an output;
a pass gate that has an input terminal configured to receive the output of the first inverter, a first control terminal configured to receive the inverted second code, a second control terminal receiving the output of the second inverter and an output terminal;
a transistor that has a gate configured to receive the output of the second inverter, a source coupled to the output terminal of the pass gate, and a drain coupled to a power supply terminal; and
a third inverter that is coupled to the source of the transistor; and wherein
a number of logic circuits is equal to a number of bits of the inverted second code.

9. The data output driving circuit of claim 4,
wherein the pull-up driver control unit includes:
a first inverter configured to receive the driver enable signal and output an inverted driver enable signal;
second to seventh inverters configured to receive the first code to produce respective outputs; and
first to sixth NOR gates, each of which has a first input terminal to receive the inverted driver enable signal, and a second input terminal configured to receive the output of respective ones of the second to seventh inverters to output the first code.

10. The data output driving circuit of claim 4,
wherein the pull-down driver control unit includes:
first to sixth NAND gates, each of which has a first input terminal to receive the driver enable signal, and a second input terminal configured to receive the second code to output an inverted second code.

11. The data output driving circuit of claim 1,
wherein a number of the plurality of driving units is less than a predetermined number of driving impedance values.

12. A data output driving circuit of a semiconductor memory apparatus, the data output driving circuit comprising:
a plurality of driving units connected in parallel and having a different impedance values from one another, a number of driving units being less than a predetermined number of driving impedance values, the different impedance values including an impedance value corresponding to a lowest common multiple of the driving impedance values, and other impedance values corresponding to divisors of the lowest common multiple which can obtain the driving impedance values by combining with the lowest common multiple;
a plurality of driving control units configured to select one or more data processing units of a plurality of data processing units in response to a driver enable signal, pass one or more codes to the selected data processing units, and output signals fixed at a specific level to un-selected data processing units; and
the plurality of data processing units configured to output pull-up data and pull-down data to a driving unit of the plurality of driving units when to the one or more codes are input,
wherein the plurality of driving units are connected to parallel.

13. The data output driving circuit of claim 12,
wherein the driving control unit includes:
a data converting unit configured to invert the pull-up data and pull-down data to enable pull-up and pull-down driving;
a pull-up driver control unit configured to determine whether or not to output a first code from the one or more codes according to the driver enable signal; and
a pull-down driver control unit configured to determine whether or not to output a second code from the one or more codes according to the driver enable signal.

14. The data output driving circuit of claim 13,
wherein the data converting unit includes:
a first inverter configured to receive the pull-up data and output inverted pull-up data; and
a second inverter configured to receive the pull-down data and output inverted pull-down data.

15. The data output driving circuit of claim 14,
wherein the data processing unit includes:
a pull-up data processing unit configured to output the inverted pull-up data to the driving unit according to the first code; and
a pull-down data processing unit configured to output the inverted pull-down data to the driving unit according to an inverted second code.

16. The data output driving circuit of claim 15,
wherein the pull-up data processing unit includes logic circuits, each of which includes:
a first inverter configured to receive the inverted pull-up data and to produce an output;
a second inverter that receives the first code and having an output;
a pass gate that has an input terminal configured to receive the output of the first inverter, a first control terminal configured to receive the output of the second inverter, a second control terminal configured to receive the first code, and an output terminal;
a transistor that has a gate configured to receive the output of the second inverter, a drain coupled to the output terminal of the pass gate, and a source coupled to a ground terminal; and
a third inverter that is coupled to the drain of the transistor; and wherein
a number of the logic circuits is equal to a number of bits of the first code.

17. The data output driving circuit of claim 15,
wherein the pull-down data processing unit includes logic circuits, each of which includes:
a first inverter configured to receive the inverted pull-down data and to produce an output;
a second inverter configured to receive the inverted second code and to produce an output;
a pass gate that has an input terminal configured to receive the output of the first inverter, a first control terminal configured to receive the inverted second code, a second control terminal configured to receive the output of the second inverter, and an output terminal;
a transistor that has a gate configured to receive the output of the second inverter, a source coupled to the output terminal of the pass gate, and a drain coupled to a power supply terminal; and
a third inverter that is coupled to the source of the transistor; and wherein
a number of logic circuits is equal to a number of bits of the inverted second code.

18. The data output driving circuit of claim 13,
wherein the pull-up driver control unit includes:
a first inverter configured to receive the driver enable signal and output an inverted driver enable signal;
second to seventh inverters configured to receive the first code and to produce respective outputs; and
first to sixth NOR gates, each of which has a first input terminal configured to receive the inverted driver enable signal, and a second input terminal configured to receive the output of respective ones of the second to seventh inverters to output the first code.

19. The data output driving circuit of claim 13,
wherein the pull-down driver control unit includes first to sixth NAND gates, each of which has a first input terminal configured to receive the driver enable signal, and a second input terminal configured to receive the second code to output an inverted second code.

20. A data output driving circuit of a semiconductor memory apparatus, the data output driving circuit comprising:
a plurality of driving units connected in parallel and having different impedance values from one another, wherein the different values include one impedance value that is equal to a maximum impedance value of a plurality of target impedance values, and one or more impedance values that are equal to or larger than a minimum value of the target impedance values, and correspond to devisors of the maximum impedance value; and
a driving control unit configured to selectively operate the plurality of driving units in different combinations corresponding to each of the plurality of target impedance values,
wherein the plurality of driving units are connected in parallel, and the driving control unit outputs pull-up data and pull-down data to the driving units according to a first code and a second code, wherein the driving control unit selects one or more driving units of the plurality of driving units in response to a driver enable signal, and the driving control unit outputs the pull-up data and pull-down data corresponding to the first and second code to selected driving units and outputs the pull-up data and pull-down data fixed at a specific level regardless of the first and second code to un-selected driving units.

21. The data output driving circuit of claim 20,
wherein the driving unit includes:
a plurality of first switching elements that are coupled in parallel to a power supply terminal;
a plurality of first resistors, each having first and second terminals, the first terminals coupled to each of the first switching elements;
a plurality of second resistors, each having first and second terminals, the first terminals coupled to the second terminal of each of the plurality of first resistors; and
a plurality of second switching elements that are coupled in parallel to a ground terminal and to respective ones of the second terminals of the plurality of second resistors.

22. The data output driving circuit of claim 20,
wherein the driving control unit includes:
a data converting unit configured to convert the pull-up data and the pull-down data so as to enable pull-up and pull-down driving;
a pull-up driver control unit configured to determine whether or not to output the first code according to the driver enable signal; and
a pull-down driver control unit configured to determine whether or not to output the second code according to the driver enable signal.

23. The data output driving circuit of claim 22,
wherein the data converting unit includes:
a first inverter configured to receive the pull-up data and output inverted pull-up data; and
a second inverter configured to receive the pull-down data and output inverted pull-down data.

24. The data output driving circuit of claim 22,
wherein the pull-up driver control unit includes:
a first inverter configured to receive the driver enable signal and output an inverted driver enable signal;
second to seventh inverters configured to receive the first code and to produce an output; and
first to sixth NOR gates, each of which has a first input terminal configured to receive the inverted driver enable signal, and a second input terminal configured to receive the output of respective ones of the second to seventh inverters to output the first code.

25. The data output driving circuit of claim 22, wherein the pull-down driver control unit includes first to sixth NAND gates, each of which has a first input terminal configured to receive the driver enable signal, and a second input terminal configured to receive the second code to output an inverted second code.

26. A data output driving circuit of a semiconductor memory apparatus, the data output driving circuit comprising:
a first driving unit having a first impedance value equal to a maximum impedance value of a plurality of target impedance values;
a second driving unit having a second impedance value equal to or larger than a minimum value of the target impedance values, and that corresponds to a divisor of the maximum impedance value;
a third driving unit having a third impedance value equal to or larger than the minimum value among the target impedance values, corresponding to a divisor of the maximum impedance value, and smaller than the second impedance value; and
a driving control unit configured to selectively operate the first to third driving units in different combinations corresponding to each of the plurality of target impedance values,
where the first driving unit, second driving unit, and the third driving unit are connected in parallel, and the driving control unit outputs pull-up data and pull-down data to the driving units according to a first code and a second code,
wherein the driving control unit selects one or more driving units of the plurality of driving units in response to a driver enable signal, and the driving control unit outputs the pull-up data and the pull-down data corresponding to the first and second code to selected driving units and outputs the pull-up data and pull-down data fixed at a specific level regardless of the first and second code to un-selected driving units.

27. The data output driving circuit of claim 26, wherein the first impedance values is 240 ohm, the second impedance value is 120 ohm, and the third impedance value is 60 ohm.

28. The data output driving circuit of claim 26, wherein each of the first to third driving units includes:
a plurality of first switching elements that are coupled in parallel to a power supply terminal;
a plurality of first resistors, each having a first and second terminals, the first terminals coupled to respective ones of the plurality of first switching elements;
a plurality of second resistors, each having first and second terminals, the first terminals coupled to respective second terminals of each of the plurality of first resistors; and
a plurality of second switching elements that are coupled in parallel to a ground terminal and to respective second terminals of the plurality of second resistors.

29. The data output driving circuit of claim 26, wherein the driving control unit includes:
a data converting unit configured to convert the pull-up data and the pull-down data so as to enable pull-up and pull-down driving;
a pull-up driver control unit configured to determine whether or not to output the first code according to the driver enable signal; and
a pull-down driver control unit configured to determine whether or not to output the second code according to the driver enable signal.

30. The data output driving circuit of claim 29, wherein the data converting unit includes:
a first inverter configured to receive the pull-up data and output inverted pull-up data; and
a second inverter configured to receive the pull-down data and output inverted pull-down data.

31. The data output driving circuit of claim 29, wherein the pull-up driver control unit includes:
a first inverter configured to receive the driver enable signal and output an inverted driver enable signal;
second to seventh inverters configured to receive the first code and to produce an output; and
first to sixth NOR gates, each of which has a first input terminal configured to receive the inverted driver enable signal, and a second input terminal configured to receive the output of respective ones of the second to seventh inverters so as to output the first code.

32. The data output driving circuit of claim 29, wherein the pull-down driver control unit includes first to sixth NAND gates, each of which has a first input terminal configured to receive the driver enable signal, and a second input terminal configured to receive the second code so as to output an inverted second code.

* * * * *